United States Patent
Krishnaraj et al.

(10) Patent No.: US 7,399,707 B2
(45) Date of Patent: *Jul. 15, 2008

(54) IN SITU APPLICATION OF ETCH BACK FOR IMPROVED DEPOSITION INTO HIGH-ASPECT-RATIO FEATURES

(75) Inventors: Padmanabhan Krishnaraj, San Francisco, CA (US); Pavel Ionov, Sunnyvale, CA (US); Canfeng Lai, Fremont, CA (US); Michael Santiago Cox, Davenport, CA (US); Shamouil Shamouilian, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 182 days.

This patent is subject to a terminal disclaimer.

(21) Appl. No.: 11/036,632

(22) Filed: Jan. 13, 2005

(65) Prior Publication Data

US 2005/0124166 A1    Jun. 9, 2005

Related U.S. Application Data

(63) Continuation of application No. 10/057,014, filed on Jan. 24, 2002, now Pat. No. 6,869,880.

(51) Int. Cl.
*H01L 21/302* (2006.01)
(52) U.S. Cl. .................. 438/706; 438/702; 438/714
(58) Field of Classification Search ................ 438/694, 438/695, 699, 700, 702, 703, 706, 710, 714, 438/723, 724
See application file for complete search history.

(56) References Cited

U.S. PATENT DOCUMENTS

| | | | |
|---|---|---|---|
| 4,690,746 A | 9/1987 | McInerney et al. | |
| 4,872,947 A | 10/1989 | Wang et al. | |
| 4,892,753 A | 1/1990 | Wang et al. | |
| 4,960,488 A | 10/1990 | Law et al. | |
| 5,000,113 A | 3/1991 | Wang et al. | |
| 5,061,838 A | 10/1991 | Lane et al. | |
| 5,089,442 A | 2/1992 | Olmer | |
| 5,156,881 A | 10/1992 | Okano et al. | |
| 5,252,178 A | 10/1993 | Moslehi | |
| 5,271,972 A | 12/1993 | Kwok et al. | |
| 5,275,977 A | 1/1994 | Otsubo et al. | |
| 5,279,865 A | 1/1994 | Chebi et al. | |
| 5,290,382 A | 3/1994 | Zarowin et al. | |
| 5,302,233 A | 4/1994 | Kim et al. | |
| 5,319,247 A | 6/1994 | Matsuura | |

(Continued)

FOREIGN PATENT DOCUMENTS

| JP | 2058836 A | 2/1990 |
|---|---|---|
| JP | 7-161703 A | 6/1995 |

OTHER PUBLICATIONS

Abraham, "Reactive Facet Tapering of Plasma Oxide For Multilevel Interconnect Applications," VMIC Conference. pp. 115-121 (1987).

(Continued)

*Primary Examiner*—Kin-Chan Chen
(74) *Attorney, Agent, or Firm*—Townsend and Townsend and Crew

(57) ABSTRACT

A continuous in situ process of deposition, etching, and deposition is provided for forming a film on a substrate using a plasma process. The etch-back may be performed without separate plasma activation of the etchant gas. The sequence of deposition, etching, and deposition permits features with high aspect ratios to be filled, while the continuity of the process results in improved uniformity.

7 Claims, 3 Drawing Sheets

U.S. PATENT DOCUMENTS

| | | | |
|---|---|---|---|
| 5,362,526 A | 11/1994 | Wang et al. | |
| 5,416,048 A | 5/1995 | Blalock et al. | |
| 5,468,342 A | 11/1995 | Nulty et al. | |
| 5,571,576 A | 11/1996 | Qian et al. | |
| 5,599,740 A | 2/1997 | Jang et al. | |
| 5,624,582 A | 4/1997 | Cain | |
| 5,679,606 A | 10/1997 | Wang et al. | |
| 5,719,085 A | 2/1998 | Moon et al. | |
| 5,850,105 A | 12/1998 | Dawson et al. | |
| 5,858,876 A | 1/1999 | Chew | |
| 5,872,052 A | 2/1999 | Iyer | |
| 5,872,058 A | 2/1999 | Van Cleemput et al. | |
| 5,891,349 A | 4/1999 | Tobe et al. | |
| 5,913,140 A | 6/1999 | Roche et al. | |
| 5,915,190 A | 6/1999 | Pirkle | |
| 5,920,792 A | 7/1999 | Lin | |
| 5,937,323 A | 8/1999 | Orczyk et al. | |
| 5,953,635 A | 9/1999 | Andideh | |
| 5,968,610 A | 10/1999 | Liu et al. | |
| 5,990,000 A | 11/1999 | Hong et al. | |
| 6,030,881 A * | 2/2000 | Papasouliotis et al. | 438/424 |
| 6,037,018 A | 3/2000 | Jang et al. | |
| 6,039,851 A | 3/2000 | Iyer | |
| 6,059,643 A | 5/2000 | Hu et al. | |
| 6,080,529 A * | 6/2000 | Ye et al. | 430/318 |
| 6,099,697 A | 8/2000 | Hausmann | |
| 6,136,685 A | 10/2000 | Narwankar et al. | |
| 6,150,628 A * | 11/2000 | Smith et al. | 219/121.54 |
| 6,167,834 B1 | 1/2001 | Wang et al. | |
| 6,170,428 B1 | 1/2001 | Redeker et al. | |
| 6,174,451 B1 * | 1/2001 | Hung et al. | 216/67 |
| 6,182,602 B1 | 2/2001 | Redeker et al. | |
| 6,189,483 B1 | 2/2001 | Ishikawa et al. | |
| 6,191,026 B1 | 2/2001 | Rana et al. | |
| 6,194,038 B1 | 2/2001 | Rossman | |
| 6,197,705 B1 | 3/2001 | Vassiliev | |
| 6,203,863 B1 | 3/2001 | Liu et al. | |
| 6,335,288 B1 * | 1/2002 | Kwan et al. | 438/694 |
| 6,337,282 B2 * | 1/2002 | Kim et al. | 438/699 |
| 6,395,150 B1 * | 5/2002 | Van Cleemput et al. | 204/192.37 |
| 6,503,843 B1 * | 1/2003 | Xia et al. | 438/706 |
| 6,740,601 B2 | 5/2004 | Tan et al. | |
| 2001/0028922 A1 * | 10/2001 | Sandhu | 427/255.27 |

OTHER PUBLICATIONS

Lee et al., "Dielectric Planarization Techniques For Narrow Pitch Multilevel Interconnects," VMIC Conference, pp. 85-92 (1987).

Musaka, "Single Step Gap Filling Technology fo Subhalf Micron Metal Spacings on Plasma Enhanced TEOS/O2 Chemical Vapor Deposition System," International Conference on Solid State Devices and Materials pp. 510-512, held in Japan, (1993).

Qian et al., "High Density Plasma Deposition and Deep Submicron Gap Fill with Low Dielectric Constant SiO2 Films," DUMIC Conference, Feb. 21-22, 1995, pp. 50-56, held in California.

Vassiliev et al., "Trends in void-free pre-metal CVD dielectrics," Solid State Technology, Mar. 2001, pp. 129-136, www.solid-state.com.

* cited by examiner

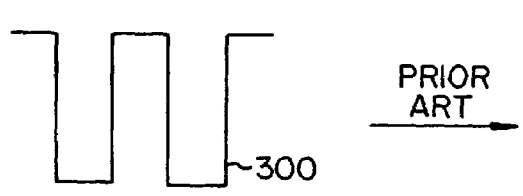
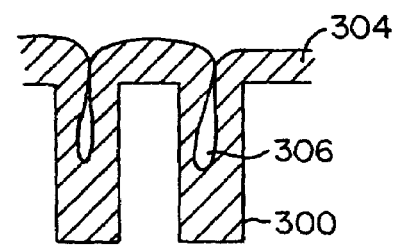
FIG. 3A.  FIG. 3B.
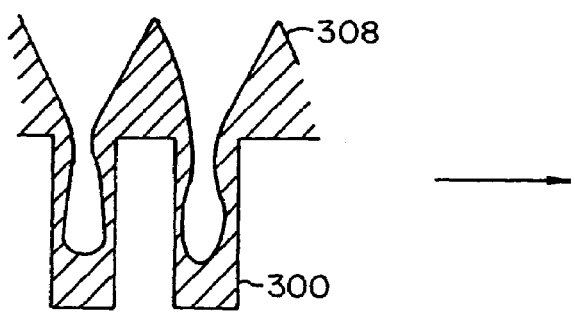
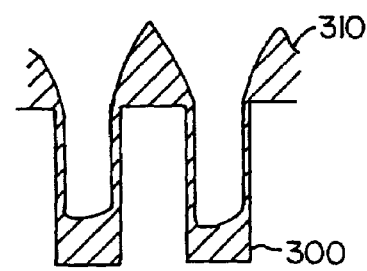
FIG. 3C.  FIG. 3D.
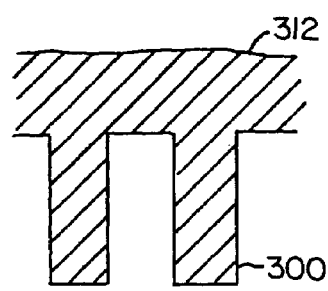
FIG. 3E.

IN SITU APPLICATION OF ETCH BACK FOR IMPROVED DEPOSITION INTO HIGH-ASPECT-RATIO FEATURES

CROSS REFERENCE TO RELATED APPLICATION

This application is a continuation of U.S. application Ser. No. 10/057,014, now U.S. Pat. No. 6,869,880, entitled "IN SITU APPLICATION OF ETCH BACK FOR IMPROVED DEPOSITION INTO HIGH-ASPECT-RATIO FEATURES," filed Jan. 24, 2002 by Padmanabhan Krishnaraj et al., the entire disclosure of which is incorporated herein by reference for all purposes.

BACKGROUND OF THE INVENTION

One of the primary steps in the fabrication of modern semiconductor devices is the formation of a thin film on a semiconductor substrate by chemical reaction of gases. Such a deposition process is referred to as chemical vapor deposition ("CVD"). Conventional thermal CVD processes supply reactive gases to the substrate surface where heat-induced chemical reactions take place to produce a desired film. Plasma-enhanced CVD ("PECVD") techniques, on the other hand, promote excitation and/or dissociation of the reactant gases by the application of radio-frequency ("RF") energy to a reaction zone near the substrate surface, thereby creating a plasma. The high reactivity of the species in the plasma reduces the energy required for a chemical reaction to take place, and thus lowers the temperature required for such CVD processes as compared to conventional thermal CVD processes. These advantages are further exploited by high-density-plasma ("HDP") CVD techniques, in which a dense plasma is formed at low vacuum pressures so that the plasma species are even more reactive.

As semiconductor device geometries have decreased in size over the years, the ratio of the height of such gaps to their width, the so-called "aspect ratio," has increased dramatically. Gaps having a combination of a high aspect ratio and a small width present a challenge for semiconductor manufacturers to fill completely. In short, the challenge usually is to prevent the deposited film from growing in a manner that closes off the gap before it is filled. Failure to fill the gap completely results in the formation of voids in the deposited layer, which may adversely affect device operation, such as by trapping undesirable impurities.

One process that the semiconductor industry has developed to improve gapfill capability uses a multistep deposition and etching process. Such a process is often referred to as a deposition/etch/deposition ("dep/etch/dep") process. Such dep/etch/dep processes divide the deposition of the gapfill layer into two or more steps separated by a plasma etch step. The plasma etch step etches the upper corners of the first deposited film more than the film portion deposited on the sidewall and lower portion of the gap, thereby enabling the subsequent deposition step to fill the gap without prematurely closing it off. Typically, dep/etch/dep processes can be used to fill higher-aspect-ratio small-width gaps than a standard deposition step for the particular chemistry would allow.

Notably, while there has been some recognition that in situ etch processes may be desirable for dep/etch/dep processes, in practice attempts at such processes have been constrained by limitations in the effectiveness of plasma processing systems. For example, one type of plasma processing chamber places a wafer on an electrode of the plasma circuit, opposite another planar electrode, and capacitively couples high-frequency electrical power to the two electrodes to form a plasma between them. Such a plasma reactor has advantages where it is desirable to form the plasma in the presence of the substrate, such as when the physical movement of plasma species to and from the substrate is desired. However, the bombardment by plasma species that results from this type of plasma formation may be undesirable for dep/etch/dep processes.

Another approach to plasma processing generates plasma in a remote location, and couples the plasma to a processing chamber. Various types of plasma generators have been developed, including magnetron sources coupled to a cavity, inductively coupled toroidal sources, microwave irradiation directed at a plasma precursor, electron-cyclotron resonance generators, and others. Remote plasma techniques offer a number of advantages for certain types of processes, such as cleaning, but generally the atomic species that eventually reach the chamber are of relatively low density because of recombination effects. With dep/etch/dep processes, this may result in nonuniformities since the gas distributions differ for the deposition and etching phases.

Inductively coupled plasma systems have been developed that can generate a high-density plasma locally above a wafer, but shield the wafer from the more deleterious effects of the plasma generation by using the plasma itself as a buffer between the wafer and the plasma generation region. These systems typically rely on diffusion of plasma to provide a uniform density across the wafer surface. In one system, a dielectric dome, or chamber top, has a conductive coil would around the dome. High-frequency electric energy provided to the coil couples to a plasma precursor gas in the chamber and converts the precursor to plasma. The fields generated by the coil through the dome have an electric field component normal to the surface of the dome that causes plasma species to be directed to and from the inner surface of the dome. This field component acting on the plasma can cause physical erosion of the inside of the dome, as well as affect the power coupling to the plasma to cause a nonuniform plasma density. The possibility of damage to the dome is further increased during the etch phase of a dep/etch/dep process if the etch phase is performed in situ. This is because etchant species react chemically with the dome material, in additional to the physical bombardment of the ionic etchant species.

It is, therefore, desirable to provide improved methods of performing dep/etch/dep processes that avoid the surface erosion problems of conventional systems while taking greater advantage of the benefits of having all phases of the dep/etch/dep processes performed in situ.

SUMMARY OF THE INVENTION

Embodiments of the invention thus encompass aspects of performing in situ dep/etch/dep processes. These embodiments are generally configured as processes in which the etch-back may be performed without separate plasma activation of the etchant gas. This feature results from the use of process-chamber configurations that allow the in situ process to proceed through the phases of deposition, etch, and deposition continuously.

In one set of embodiments, a continuous in situ process is provided using a plasma source disposed within the process chamber. In such embodiments, a first gaseous mixture is provided to the process chamber, from which a plasma is generated to deposit the first portion of the film. Thereafter, an etchant gas is flowed into the process chamber without terminating the plasma to etch the first portion of the film. Thereafter, a second gaseous mixture is provided to the process chamber without terminating the plasma to deposit the second portion of the film. As before, the gaseous mixtures may include silicon- and oxygen-containing gases to deposit a silicon oxide film, and the etchant gas may include a fluorine-containing gas such as $NF_3$ or $F_2$. In different embodiments, bias power may or may not be used.

In other embodiments, the first deposition phase may be combined with the etch phase of the process by providing a gaseous mixture to the process chamber that includes both a deposition gas and an etchant gas. A plasma is generated from the gaseous mixture with a plasma coupling structure to simultaneously deposit a first portion of the film on the substrate and etch the film. The plasma includes poloidal ion flow along field lines substantially parallel to a surface interior to the process chamber and disposed to separate the plasma from the plasma coupling structure. The etchant gas acts chemically and can be controlled more easily than can, for example, the physical sputter component of a high-density-plasma deposition process. These embodiments thus provide an improved level of control.

Subsequent to the combined deposition and chemical etching, a second gaseous mixture having a second deposition gas may be provided to the process chamber to deposit a second portion of the film. This second deposition gas may be substantially the same as the first deposition gas. The deposition gases may include a silicon-containing gas, such as $SiH_4$, and an oxygen-containing gas, such as $O_2$, to deposit a silicon oxide layer. The etchant gas may include a fluorine-containing gas, such as $NF_3$ or $F_2$, which reacts with the deposited silicon layer.

Some embodiments of the invention additionally include applying an electrical bias to the substrate during the combined deposition and etching phase. The power density for the electrical bias may be sufficiently low, <3.2 W/cm², that the physical sputter component from a high-density plasma process is small. Instead, the bias acts to introduce an anisotropy in the action of the etchant that improves the overall deposition for certain features. In one embodiment, the bias power density is between 0.9 and 1.6 W/cm².

The methods of the present invention may be embodied in a computer-readable storage medium having a computer-readable program embodied therein for directing operation of a substrate processing system. Such a system may include a process chamber, a plasma generation system, a substrate holder, a gas delivery system, and a system controller. The computer-readable program includes instructions for operating the substrate processing system to form a thin film on a substrate disposed in the processing chamber in accordance with the embodiments described above.

A further understanding of the nature and advantages of the present invention may be realized by reference to the remaining portions of the specification and the drawings.

BRIEF DESCRIPTION OF THE DRAWINGS

FIGS. 3A-3E illustrate how a high-aspect-ratio feature may be filled with the procedure of FIG. 2.

DESCRIPTION OF THE SPECIFIC EMBODIMENTS

1. Introduction

Embodiments of the invention use a continuous in situ plasma for all phases of a dep/etch/dep process. This is achieved with a chamber design that disposes the plasma source, which may be a toroidal plasma source, within the process chamber. Such a design and process have a number of advantages. For example, the chamber design is especially suitable for processes that use etchant gases because it does not include a capacitive coupling between the dome and plasma-generation coils. This allows in situ processing with etchants while avoiding undesirable surface erosion within the process chamber. This process is unlike previous dep/etch/dep processes, which were instead generally adapted for remote-plasma etch phases; attempts to adapt those processes to in situ etch phases resulted in the deficiencies described above.

In embodiments of the invention, the dep/etch/dep process is accordingly performed as a continuous process without the need for separate plasma generation in each of the individual phases. The continuity of such a process results in increased process uniformity across a wafer. In particular, such continuity results in the same gas distribution for the deposition gases and for the etchant gas during their respective phases. Thus, even if this distribution includes some degree of nonuniformity, the multiple phases of the process tend to compensate. In regions of a wafer where the deposition is greater (smaller) than average, the degree of etching is similarly greater (smaller) than average.

This process uniformity is further enhanced because the in situ toroidal configuration by itself tends to decrease the degree of nonuniformity in all the gas distributions. The toroidal configuration produces field lines predominantly parallel to, rather than perpendicular to, the interior chamber surfaces separating the coupling structure from the plasma. As a result, poloidal ion flow is provided with symmetry about the central axis of the toroid, which contributes to the improvements in process uniformity.

2. Exemplary Substrate Processing System

Figure 1:
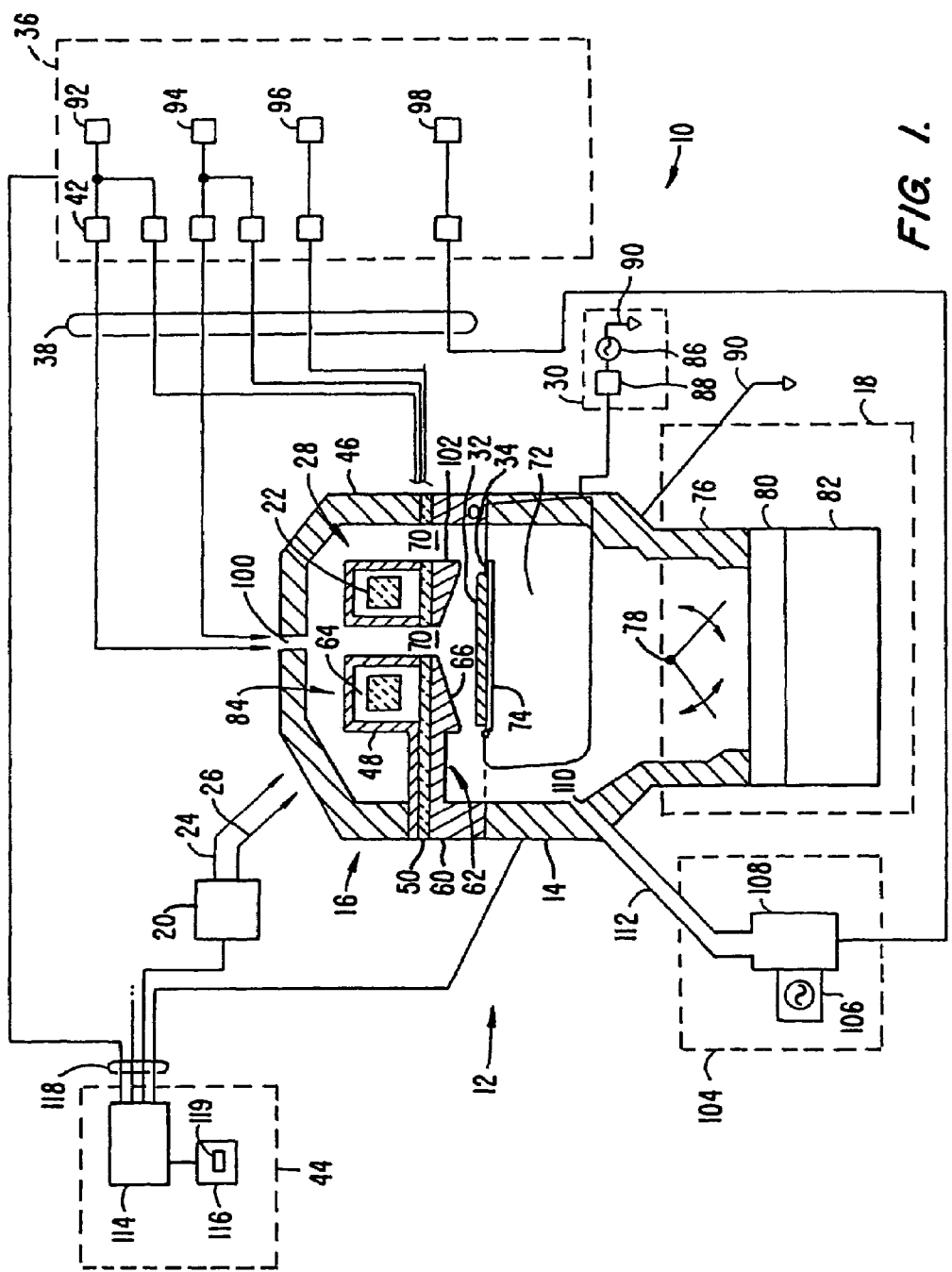
FIG. 1 is a simplified diagram of one embodiment of a high density chemical vapor deposition system according to an embodiment of the present invention.

FIG. 1 illustrates one embodiment of a plasma processing system 10 suitable for a variety of plasma processes, such as plasma-enhanced deposition processes and plasma etch processes. In one embodiment, it may be used for a continuous dep/etch/dep process. In some embodiments, a high-density plasma may be generated from a gaseous mixture, where "high-density" is understood in this context to mean having an ion density that is equal to or exceeds $10^{11}$ ions/cm³. Plasma processing system 10 includes a chamber 12 having a chamber body 14 and a chamber top 16, a vacuum system 18, an RF generator (power supply) 20 coupled to a toroidal core 22 by leads 24, 26 by a coil (not shown). In one embodiment the toroidal core 22 is a ferrite core, but could be other magnetic material, or merely free space ("air") depending on the coupling structure. A bias plasma system 30 is optional for producing movement in the plasma normal to the surface 32 of a substrate 34. The substrate could be a silicon wafer, for example, or another substrate. For ease of description, the surface 32 is referred to as the "process surface" of the substrate. It is understood that the process surface may include layers and structures previously formed on the substrate. In certain embodiments, the wafer is a silicon wafer with a nominal diameter of 200 mm or 300 mm.

A gas delivery system 36 provides gas(es) to the processing chamber and other system components through gas delivery lines 38, only some of which might be shown. Typical gases provided by the gas delivery system 36 might include plasma precursor gases, such as a cleaning or etching plasma precursor gas, a plasma deposition precursor gas, plasma striking gas, plasma dilution gas, and other gases, such as a cleaning precursor gas provided to an optional remote plasma cleaning system 40, for example. The delivery lines generally include some sort of control, such as a mass flow controller 42 and shut-off valves (not shown). The timing and rate of flow of the various gases is controlled through a system controller 44, as will be described in further detail below.

The chamber top 16 includes an outer shell 46, a toroid cover 48, an insulative spacer 50, and a bottom plate 60. The bottom plate 60 may be shaped to provide a selected plasma density distribution. The outer shell, toroid cover, and bottom plate can be made of aluminum, anodized aluminum, stainless steel, or other material as appropriate for the intended processes to be performed. A surface coating can be applied to the inner surfaces of some chamber components, if desired, to reduce the potential for contamination of the substrate or chamber. The insulative spacer 50 is typically made from a dielectric material such as ceramic; examples include alumina-based ceramic or aluminum nitride, silicon, and fused silica. It is generally desirable that the insulative spacer prevent substantial induced current flow between the chamber body 14 and any electrically conductive parts of the chamber top 16. In a particular embodiment, the insulative spacer is high-alumina ceramic about 20 mm thick.

The toroid cover 48 contains a toroidal core 22. In one embodiment the toroidal core is made of a ferrite material, such as a material sold under the trade designation "3F3" by ROYAL PHILIPS ELECTRONICS, N.V., but other ferrites or materials, such as iron, or air, may be appropriate. The RF generator is coupled to the core by coiling the leads 24, 26 around the core. Alternative and equivalent coupling structures will be apparent to those skilled in the art. Although two leads are shown connecting the RF generator to the core, an alternative circuit configuration using a single lead and common ground could be used. Specifically, the RF generator could be mounted directly on the chamber structure, thus avoiding long leads to the coil and associated electromagnetic radiation, as well as reducing variations in load resulting from long leads and eliminating the RF matching network. The core, coil, and generated plasma form a transformer circuit that operates as a toroidal plasma source 28 within the processing chamber when in operation. The primary circuit of the transformer is the coil, with the plasma serving as the secondary circuit of the transformer, the primary coupling to the secondary through the core.

The entire transformer (plasma source) is within the processing chamber. As described above, the outer shell 46 and chamber body 14 can be made of a conductive material, thus serving as a shield for electronic emissions generated by the toroidal plasma source 28. This not only reduces unwanted emissions from the system, but also may allow the RF generator 20 to operate at frequencies that would otherwise generate an unacceptable level of electronic noise emissions. In such an embodiment, it may be desirable to provide leads from the RF generator to the chamber that are shielded. Additional shielding may be appropriate around dielectric elements, such as the insulative spacer.

In a preferred embodiment the leads are provided through a toroidal plasma source support structure, such as a spoke 62. For example, the leads could come through the bottom plate and then into the toroidal cavity 64 containing the toroidal core 22. Alternatively, support for the toroidal plasma source could be provided by support structure(s) dropping down from the chamber top. In one embodiment (not illustrated in FIG. 1), four spokes support the toroidal core, shaped (center) portion 66 of the bottom plate 60, and toroid cover 48 in the interior of the chamber 70. The cross section illustrated in FIG. 1 is consistent with a 1, 3, 5, etc. spoke pattern. In an alternative embodiment, the leads are brought through a feed-through (not shown) in the outer shell 46 and through the toroid cover 48.

The chamber body 14 includes a substrate support member 72, which is mounted on, and forms a continuous inner surface with, the body. Substrates are transferred into and out of chamber by a robot blade (not shown) through an insertion/removal opening (not shown) in the side of the chamber. Motor-controlled lift pins (not shown) are raised and then lowered to transfer the substrate from the robot blade to the substrate support member 72. A substrate receiving portion 74 of the substrate support member can include a wafer hold-down apparatus, such as an electrostatic chuck (not shown), that can selectively secure the substrate to the substrate support member during substrate processing, if desired. In one embodiment, the substrate support member 72 is made from anodized aluminum, aluminum, or aluminum oxide. The substrate support member may also include a heater (not shown) to heat the wafer during processing, or to heat portions of the chamber during a cleaning process. In one embodiment, the substrate support member holds the substrate 36 so that the processing surface 34 of the substrate is opposite and essentially parallel to the major plane of the toroid. That is, the processing surface faces the loop described by the toroidal core.

The vacuum system 18 includes throttle body 76, which houses twin-blade throttle valve 78 and is attached to gate valve 80 and turbo-molecular pump 82. It should be noted that throttle body 76 offers minimum obstruction to gas flow, and allows symmetric pumping, as described in co-pending, commonly assigned U.S. patent application Ser. No. 08/712,724 entitled "SYMMETRIC CHAMBER" by Ishikawa, filed Sep. 11, 1996, and which is incorporated herein by reference in its entirety for all purposes. The gate valve can isolate the turbo-molecular pump from the throttle body, and can also control chamber pressure by restricting the exhaust flow capacity when the throttle valve 78 is fully open. The arrangement of the throttle valve, gate valve, and turbo-molecular pump allow accurate and stable control of chamber pressures from about 1 millitorr to about 2 torr. It is understood that other types of vacuum pumps and configurations of vacuum systems could be used with alternative embodiments of the present invention.

The RF generator 44 operates at a nominal frequency of 400 kHz, but could operate at different frequencies, such as 60 Hz, 2 MHz, 13.56 MHz, 60 MHz, or 200 MHz among others, with appropriate design of the elements of the plasma system. The RF generator can supply up to 8 kW, but the processing system typically draws about 3-5 kW when processing a 200-mm wafer. It is understood that lower or higher power levels might be appropriate according to the type of process being performed and the size of the substrate.

A particular advantage of embodiments of the present invention utilizing a ferrite core is the relatively low quality factor ("Q") of the toroidal plasma generating structure 84, which includes the core, coil, and cover. The low Q also reduces the sensitivity of the plasma system to the chamber load, thus resulting in a more stable and consistent plasma operated over a wider process range. In a high-Q system, the power delivered to the plasma can vary as the plasma is formed or chamber conditions change. For example, a plasma might be initiated with a plasma striker gas, such as argon. When a precursor gas, such as $NF_3$ or $F_2$, is provided to the plasma, the dissociation of the gas into plasma creates a sudden increase in plasma species (pressure) as well as electrically charged particles. This effect can change the load on the power supply as well as the match to the load, resulting in reduced power transfer to the plasma and potentially reflecting a harmful level of power back to the generator. In the present system, a low-Q configuration can be implemented, avoiding these problems.

A bias plasma system 30 includes a bias generator 86 and an optional bias matching network 88. The bias plasma system capacitively couples the substrate receiving portion 74, i.e. the substrate, to conductive (grounded) inner surfaces of the chamber through a common ground 90. The bias plasma system serves to enhance the transport of plasma species (e.g. reactive ions or other particles) created by the plasma generating structure 84 to the surface 32 of the substrate.

The gas delivery system 36 provides gases from several gas sources 92, 94, 96, 98 to the chamber and other system components via the gas delivery lines 38 (only some of which might be shown). Gases can be introduced into the chamber in a variety of fashions. For example, a top port 100 is shown as one example of a means of flowing gases into the chamber. A gas mixing chamber (not shown) can be present between the gas sources and the chamber, or the top port can be arranged with a number of parallel or concentric gas conduits to keep various gases separate until reaching the chamber. In an alternate embodiment, gas conduits are present in the spoke(s) supporting the toroidal plasma generating structure 84 and nozzles (ports) are provided in the center portion of the chamber top. In yet another alternative embodiment, a gas delivery ring with a series of gas nozzles is provided about an inner circumference of the processing chamber. If gas ports are provided in the outer perimeter portion 102 of the bottom plate 60, then it is generally desirable that the outer perimeter portion extend beyond the edge of the substrate, to reduce the chance of particles forming at the outer perimeter portion falling on the surface of the substrate.

An optional remote plasma cleaning system 104 is provided to clean deposition residues from chamber components periodically. The cleaning system includes a remote microwave or RF generator 106 that creates a plasma from a cleaning gas source 98 such as molecular fluorine, nitrogen trifluoride, other fluorocarbons, or equivalents in a reactor cavity 108. The reactive species resulting from this plasma are conveyed to the chamber interior through cleaning gas feed port 110 via applicator tube 112.

The system controller 44 controls the operation of the plasma processing system 10. In a preferred embodiment, the system controller includes a processor 114 coupled to a memory 116, such as a hard disk drive, a floppy disk drive (not shown), and a card rack (not shown). The card rack may contain a single-board computer (SBC) (not shown), analog and digital input/output boards (not shown), interface boards (not shown), and stepper motor controller boards (not shown). The system controller is coupled to other parts of the processing system by control lines 118 (only some of which might be shown), which may include system control signals from the controller and feedback signals from the system. The system controller conforms to the Versa Modular European (VME) standard, which defines board, card cage, and connector dimensions and types. The VME standard also defines the bus structure having a 16-bit data bus and 24-bit address bus. System controller 44 operates under the control of a computer program 119 stored on the hard disk drive or other computer programs, such as programs stored on a floppy disk. The computer program dictates, for example, the timing, mixture of gases, RF power levels and other parameters of a particular process. The interface between a user and the system controller is via a monitor (not shown), such as a cathode ray tube (CRT), and a light pen (also not shown).

It is specifically understood that other types of chambers might be adapted to a toroidal plasma source according to the present invention, and that different types of wafer support systems, such as a center pedestal, might be used, as well as different exhaust configurations, such as a perimeter exhaust configuration. In particular, additional coils might be added to control the plasma density and distribution (uniformity) inside the processing chamber. For example, instead of the metal outer shell described in conjunction with FIG. 1, a dielectric dome or shell could be used, and a coil provided outside the chamber, or a coupling structure(s), such as a pole face of a solenoid, could couple to the interior of the chamber through a chamber wall. Similarly, additional coils or other coupling structures could be provided within the chamber to manipulate the plasma. Such coils might lie above, below, or essentially coplanar with the toroidal plasma source. Additional embodiments for the substrate processing system are set forth in U.S. patent application Ser. No. 09/584,167, filed May 25, 2000 by Michael S. Cox et al., entitled "TOROIDAL PLASMA SOURCE FOR PLASMA PROCESSING," the entire disclosure of which is herein incorporated by reference in its entirety for all purposes.

Other substrate processing systems may alternatively be used. One example of a system that may incorporate certain of the subsystems and routines described above and which may be adapted for performing methods in accordance with the invention is the ULTIMA™ system, manufactured by APPLIED MATERIALS, INC., of Santa Clara, Calif. Further details of such a system are disclosed in the copending, commonly assigned U.S. patent application Ser. No. 08/679,927, filed Jul. 15, 1996, entitled "Symmetric Tunable Inductively-Coupled HDP-CVD Reactor," having Fred C. Redeker, Farhad Moghadam, Hirogi Hanawa, Tetsuya Ishikawa, Dan Maydan, Shijian Li, Brian Lue, Robert Steger, Yaxin Wang, Manus Wong and Ashok Sinha listed as co-inventors, the entire disclosure of which is incorporated herein by reference. These systems are discussed for exemplary purposes only. It would be a matter of routine skill for a person of skill in the art to select an appropriate conventional substrate processing system and computer control system to implement the present invention.

3. In Situ Deposition/Etch/Deposition Process

Figure 2:
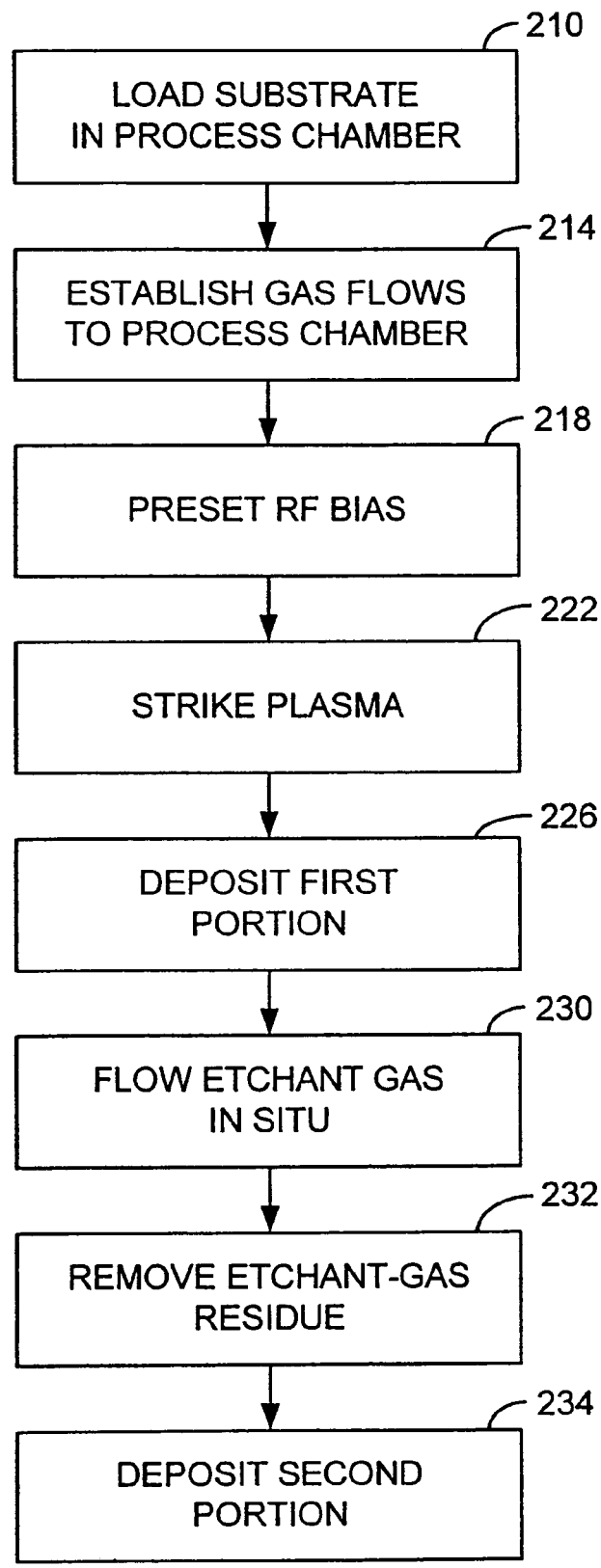
FIG. 2 is a flow diagram illustrating one embodiment of a continuous in situ dep/etch/dep process.

The in situ dep/etch/dep process used in embodiments of the invention may be understood with reference to FIGS. 2 and 3A-3E. FIG. 2 shows a flow chart of an exemplary plasma process used in one embodiment to deposit a film on a substrate with stepped surfaces forming gaps with an aspect ratio as large as 6:1-7:1, and having a width less than about 0.1 μm. The substrate is loaded into the process chamber 12 through a vacuum-lock door onto the substrate receiving portion 74 at block 210. The substrate has a process surface essentially facing and parallel to the toroidal plasma source 28. Once the substrate is properly positioned, gas flows are established at block 214 to stabilize the pressure, which is maintained throughout the first deposition of the film by manipulating the throttle valve 78 with a stepper motor while the vacuum system 18 pumps at a constant capacity. In one embodiment, the pressure is maintained at a value less than 50 mtorr. When establishing gas flows at block 214, a nominal source bias (e.g. 10 W) may be applied.

Once gas flows and pressure are established, the bias RF is preset at block 218, a relatively low power (e.g. 300 W) being used to establish proper operating conditions. A toroidal source power of, for example, 3000 W is applied within the chamber at block 222 to strike the plasma. After the plasma has been struck, the toroidal source power, RF bias, and gas flows are adjusted to the desired deposition conditions at block 226. The deposition gas may include, for example, $SiH_4$ and $O_2$ for the deposition of silicon oxide; it may additionally include sources of fluorine (e.g., $SiF_4$), boron, phosphorus, carbon, and/or nitrogen, among others, to deposit silicon oxides. The configuration of the toroidal plasma source 28 with respect to the process surface creates a poloidal plasma with theta symmetry, i.e. rotational symmetry about a central axis essentially normal to the process surface (the "toroid axis"). After being struck, the plasma is sustained by power from the toroidal plasma source 28. In alternative embodiments, the plasma may be struck from an inert plasma striker gas, such as argon, which is easily ionized to form a stable plasma.

After deposition of the first portion of the film, an etchant gas is flowed into the process chamber at block 230 to etch part of the deposited first portion. Where the deposited material is a silicon oxide, the etchant gas may include a source of fluorine atoms, such as $C_3F_8$, $CF_4$, $NF_3$, or $F_2$, among others. Because the design of the processing system is particularly suitable for in situ etching processes, the etchant may be provided without termination of the plasma. The flow of deposition gases is halted and the etchant gas supplied as a continuous process. In one embodiment, the flows are maintained as distinct flows, with the plasma being maintained by flow of an inert gas such as argon.

In another embodiment, the deposition and etchant flows overlap so that both deposition and etchant gases are provided simultaneously to process chamber 12. The plasma includes poloidal ion flow along field lines substantially parallel to a surface, such as bottom plate 60, that separates the plasma from the coupling structure. The overlapping flows may be provided for the entire deposition period so that no initial deposition phase distinct from the etching phase is provided. Providing such an overlap has the effect of producing a process that has simultaneous deposition and etching properties. This simultaneity allows features with larger aspect ratios to be filled than do deposition processes alone.

In some ways, providing simultaneous deposition-gas and etchant flows mimics the deposition behavior of HDP-CVD deposition processes. In HDP-CVD processes, it is common to introduce an inert sputtering agent, such as argon, into the deposition gas mixture, causing the process to produce both deposition and sputtering components. An important difference between this HDP-CVD process and the combined deposition and etching process used with the in situ processes of the invention is that the sputtering component is physical while the etching component is chemical. In particular, in typical HDP-CVD processes, the sputtering arises from bombardment of the substrate by ionic plasma species. According to the embodiment of the invention that uses simultaneous deposition and etching, however, the etching arises from a chemical reaction between the etchant ionic species and the substrate material.

Further, while the sputtering provided by HDP-CVD deposition processes may act act anisotropically, there may be redeposition. This is to be contrasted with performing an etching process, which generally has no redeposition. Accordingly, the effect of the HDP sputtering component is limited in gapfilling features with larger aspect ratios. The deposition material still forms with a characteristic breadloafing shape that leads to the formation of voids in the deposited layer.

In embodiments of the invention that use an etchant species, however, anisotropic etching can be provided by adding a bias with the bias plasma system 30 and exploiting the chemical nature of the reaction. Since chemical etching acts to reopen the gap, etching anisotropy can increase the efficiency of this process. A sufficient bias power to produce a reasonable anisotropic etching component for a 200-mm wafer is 300 W (corresponding to a bias power density of about 0.9 W/cm$^2$). An upper limit for the bias power is approximately 1000 W (corresponding to a bias power density of about 3.2 W/cm$^2$), at which point physical sputtering becomes significant. In one embodiment the bias power is limited to the range 300-500 W (corresponding to a bias power density of 0.9-1.6 W/cm$^2$).

Such nonisotropic etching may also be used by itself as part of the dep/etch/dep process, when the first deposition proceeds independently of the second deposition. After the etching phase at block 230, residue from the etchant gas may optionally be removed at block 232. Where the etchant gas comprises a fluorine-containing gas, such residue may include fluorine atoms deposited on surfaces within the process chamber. Removal of such residue may be performed by flowing, for example, $O_2$, Ar, or an $O_2$+Ar combination. Subsequently, or immediately after the etching phase at block 230 if the optional removal is not performed at block 232, deposition gases are again provided to the process chamber 12 at block 234 to deposit the second portion of the film. Again, by using the chamber design described above, it is possible to transition effectively between the etching phase of block 230 to the deposition phase of block 234 without terminating the plasma.

The deposition of the film with the above-described dep/etch/dep process is illustrated schematically in FIGS. 3A-3E. FIG. 3A shows a feature 300 on a substrate that is to be gapfilled. The results of a prior-art process that simply uses a deposition procedure is shown by the right arrow to FIG. 3B. The deposited layer 304 has a characteristic breadloafing shape that produces voids 306. If the dep/etch/dep process of the invention is used instead, the downwards arrow to FIG. 3C shows the result after a first deposition step such as provided by block 226. The amount of material deposited is small enough that layer 308, while showing the characteristic breadloafing, has not yet pinched off a void. The result of the etch step of block 230 is shown in FIG. 3. After etching layer 308, perhaps including a bias to perform the etch anisotropically, the profile of the resulting layer 310 mimics that of the original feature 300, but is less severe. Accordingly, the second deposition phase of block 234 can fill the feature completely, as shown in FIG. 3E.

Having fully described several embodiments of the present invention, many other equivalent or alternative methods will be apparent to those of skill in the art. These alternatives and equivalents are intended to be included within the scope of the invention, as defined by the following claims.

What is claimed is:

1. A method for depositing a film on a substrate wafer disposed within a process chamber, the method comprising:
   providing a first gaseous mixture to the process chamber;
   generating a plasma from the first gaseous mixture to deposit a first portion of the film on the substrate wafer;
   thereafter, flowing a fluorine-based etchant gas into the process chamber without terminating the plasma;
   applying an electrical bias to the substrate wafer while flowing the fluorine-based etchant gas to provide a net etching back of part of the first portion of the film; and
   thereafter, providing a second gaseous mixture to the process chamber without terminating the plasma to deposit a second portion of the film on the substrate wafer.

2. The method recited in claim 1 wherein the bias has a power density approximately between 0.9 W/cm$^2$ and 3.2 W/cm$^2$.

3. The method recited in claim 1 wherein the second gaseous mixture is substantially the same as the first gaseous mixture.

4. The method recited in claim 1 wherein the first and second gaseous mixtures each include a silicon-containing gas and an oxygen-containing gas.

5. The method recited in claim 1 wherein:
providing the first gaseous mixture to the process chamber comprises providing a flow of a source gas and a flow of a fluent gas to the process chamber; and
flowing the fluorine-based etchant gas into the process chamber without terminating the plasma comprises:
terminating the flow of the source gas without terminating the flow of the fluent gas; and
thereafter, providing a flow of the fluorine-based etchant.

6. The method recited in claim 5 wherein the fluent gas comprises an inert gas.

7. The method recited in claim 1 wherein:
providing the first gaseous mixture to the process chamber comprises providing a flow of a source gas to the process chamber; and
flowing the fluorine-based etchant gas into the process chamber without terminating the plasma comprises:
providing a flow of the fluorine-based etchant to the process chamber; and
thereafter, terminating the flow of the source gas.

* * * * *